(12) United States Patent
Xiong et al.

(10) Patent No.: US 12,089,484 B2
(45) Date of Patent: Sep. 10, 2024

(54) SUPPORT STRUCTURE SUPPORTING FLEXIBLE DISPLAY PANEL AND HAVING BENDABLE REGION, NON-BENDABLE REGION AND TRANSITIONAL REGION BETWEEN BENDABLE REGION AND NON-BENDABLE REGION

(71) Applicants: Chengdu BOE Optoelectronics Technology Co., Ltd., Sichuan (CN); BOE Technology Group Co., Ltd., Beijing (CN)

(72) Inventors: Ren Xiong, Beijing (CN); Lei Yang, Beijing (CN); Mingnan Zhou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/914,635

(22) PCT Filed: Oct. 22, 2021

(86) PCT No.: PCT/CN2021/125809
§ 371 (c)(1),
(2) Date: Sep. 26, 2022

(87) PCT Pub. No.: WO2022/105539
PCT Pub. Date: May 27, 2022

(65) Prior Publication Data
US 2023/0119924 A1     Apr. 20, 2023

(30) Foreign Application Priority Data
Nov. 23, 2020 (CN) .......................... 202011320571.5

(51) Int. Cl.
*H10K 77/10* (2023.01)
*H10K 59/10* (2023.01)
*H10K 102/00* (2023.01)

(52) U.S. Cl.
CPC .......... *H10K 77/111* (2023.02); *H10K 59/10* (2023.02); *H10K 2102/311* (2023.02)

(58) Field of Classification Search
CPC . H10K 77/111; H10K 59/10; H10K 2102/311
See application file for complete search history.

(56) References Cited

U.S. PATENT DOCUMENTS

2016/0105950 A1     4/2016  Drzaic et al.
2016/0357052 A1*   12/2016  Kim ...................... H10K 50/84
(Continued)

FOREIGN PATENT DOCUMENTS

| CN | 110992828 A | 4/2020 |
|----|-------------|--------|
| CN | 111312080 A | 6/2020 |

(Continued)

OTHER PUBLICATIONS

PCT/CN2021/125809 international search report and written opinion.

*Primary Examiner* — Kwang-Su Yang
(74) *Attorney, Agent, or Firm* — IPro, PLLC

(57) ABSTRACT

The present disclosure relates to a support structure provided on one side of a flexible display panel, comprising a bendable region, a non-bendable region and a transitional region between the bendable region and the non-bendable region; the bendable region is provided with a first hollowed-out pattern, and the first hollowed-out pattern comprises a plurality of first hollowed-out holes; the transitional region is provided with a second hollowed-out pattern, and the second hollowed-out pattern comprises a plurality of second hollowed-out holes; the density of the plurality of first hollowed-out holes is greater than the density of the plurality (Continued)

of second hollowed-out holes. The present disclosure also relates to a flexible display apparatus.

14 Claims, 3 Drawing Sheets

(56) References Cited

U.S. PATENT DOCUMENTS

| | | | |
|---|---|---|---|
| 2018/0190936 A1* | 7/2018 | Lee | ............ B32B 25/20 |
| 2019/0132987 A1* | 5/2019 | Koo | ............ H05K 7/18 |
| 2019/0165060 A1* | 5/2019 | Choi | ........... H10K 59/8723 |
| 2021/0165454 A1 | 6/2021 | Dong et al. | |
| 2022/0343809 A1 | 10/2022 | Chen et al. | |

FOREIGN PATENT DOCUMENTS

| | | |
|---|---|---|
| CN | 111316344 A | 6/2020 |
| CN | 111508357 A | 8/2020 |
| CN | 211928943 U | 11/2020 |
| CN | 112436039 A | 3/2021 |
| GB | 2606893 A | 11/2022 |

* cited by examiner

SUPPORT STRUCTURE SUPPORTING FLEXIBLE DISPLAY PANEL AND HAVING BENDABLE REGION, NON-BENDABLE REGION AND TRANSITIONAL REGION BETWEEN BENDABLE REGION AND NON-BENDABLE REGION

CROSS-REFERENCE TO RELATED APPLICATIONS

This application is the U.S. national phase of PCT Application No. PCT/CN2021/125809 filed on Oct. 22, 2021 which claims priority to Chinese Patent Application No. 202011320571.5 filed in China on Nov. 23, 2020, the entire contents of which are incorporated herein by reference.

TECHNICAL FIELD

The present disclosure relates to the field of display product fabrication, and more particularly to a support structure and a flexible display apparatus.

BACKGROUND

With the increasing size of OLED products, the occurrence of various types of mechanical impact on the back of OLED products will be correspondingly improved, resulting in a higher and higher adverse appearance; at present, the pad bending (Pad bending) technology commonly used in OLED products is used in a large size, because the panel has a large rebound force when bending, it often causes the problem of peeling (peeling) in the bending region; when designing a large-size module, a high-strength metal will be added as a support to solve the problem of film peeling. However, when the conventional metal member is attached, the metal member itself may cause problems such as severe crush and rebound to the panel.

SUMMARY

In order to solve the above technical mentioned technical problems, the present disclosure provides a support structure, a flexible display apparatus, and a method for solving the problems of bounce of a support member and severe crushing of a panel.

In order to achieve the above object, the embodiments of the present disclosure adopt the following technical solutions: a support structure for supporting a flexible display panel, comprising a bendable region, a non-bendable region and a transitional region between the bendable region and the non-bendable region;

the bendable region is provided with a first hollowed-out pattern, and the first hollowed-out pattern comprises a plurality of first hollowed-out holes;

the transitional region is provided with a second hollowed-out pattern, and the second hollowed-out pattern comprises a plurality of second hollowed-out holes;

the distribution density of the plurality of first hollowed-out holes is greater than the distribution density of the plurality of second hollowed-out holes.

Optionally, the non-bendable region comprises a first region adjacent to the transitional region, the first region is provided with a third hollowed-out pattern, the third hollowed-out pattern comprises a plurality of third hollowed-out holes, and the distribution density of the plurality of third hollowed-out holes is less than the distribution density of the plurality of second hollowed-out holes.

Optionally, the bending axis of the bendable region extends along a first direction, the first hollowed-out hole, the second hollowed-out hole and the third hollowed-out hole are strip-shaped through holes extending along the first direction, the length of the first hollowed-out hole is greater than or equal to the length of the second hollowed-out hole, and the length of the second hollowed-out hole is greater than or equal to the length of the third hollowed-out hole.

Optionally, the first hollowed-out pattern comprises a plurality of rows of first hollowed-out portions arranged side by side along a second direction perpendicular to the first direction, each row of the first hollowed-out portions comprises the plurality of first hollowed-out holes, a first connecting portion is provided between two adjacent first hollowed-out holes in each row of the first hollowed-out portions, and the projection of the first connecting portion in the second direction is located on a corresponding the first hollowed-out hole of an adjacent the first hollowed-out portion;

the second hollowed-out pattern comprises a plurality of rows of second hollowed-out portions arranged side by side along a second direction perpendicular to the first direction, each row of the second hollowed-out portions comprises a plurality of second hollowed-out holes, a second connecting portion is provided between two adjacent second hollowed-out holes in each row of the second hollowed-out portions, and the projection of the second connecting portion in the second direction is located on the second hollowed-out holes corresponding to the adjacent second hollowed-out portions;

the third hollowed-out pattern comprises a plurality of columns of third hollowed-out portions arranged side by side in a second direction perpendicular to the first direction, and each row of the third hollowed-out portions comprises a plurality of third hollowed-out holes.

Optionally, in two adjacent rows of the first hollowed-out portions in the first hollowed-out pattern, one of the first connecting portions in one row of the first hollowed-out portions is a first sub-connecting portion, and the first hollowed-out hole corresponding to the first sub-connecting portion in the other row of the first hollowed-out portions is a first sub-hollowed-out hole, and the projection of the first sub-connecting portion in the second direction is located at the center of the first sub-hollowed-out hole.

Optionally, the second hollowed-out holes comprise a first sub-hollowed-out portion and a second sub-hollowed-out portion which are arranged side by side and staggered along the first direction, the first sub-hollowed-out portion comprises a plurality of first sub-hollowed-out holes, the second sub-hollowed-out portion comprises a plurality of second sub-hollowed-out holes, the length of the first sub-hollowed-out holes is greater than the length of the second sub-hollowed-out holes, and the orthographic projection of one of the second sub-hollowed-out holes on an adjacent one of the first sub-hollowed-out portions is located in the middle of the corresponding one of the first sub-hollowed-out holes.

Optionally, two adjacent first hollowed-out holes in the same column of the first hollowed-out portions have a first spacing therebetween, two adjacent second hollowed-out holes in the same column of the second hollowed-out portions have a second spacing therebetween, and two adjacent third hollowed-out portions in the same column of the third hollowed-out portions have a third spacing therebetween, the first spacing being less than or equal to the second spacing, and the second spacing being less than or equal to the third spacing.

Optionally, the first pitch is less than the second pitch and the second pitch is less than the third pitch.

Optionally, two adjacent rows of the first hollowed-out portions have a fourth spacing in the second direction, two adjacent rows of the second hollowed-out portions have a fifth spacing in the second direction, and two adjacent rows of the third hollowed-out portions have a sixth spacing therebetween, the fourth spacing being less than or equal to the fifth spacing, and the fifth spacing being less than or equal to the sixth spacing.

Optionally, the fourth pitch is less than the fifth pitch and the fifth pitch is less than the sixth pitch.

Optionally, the first hollowed-out hole, the second hollowed-out hole and the third hollowed-out hole have the same width in the second direction.

Optionally, the first hollowed-out pattern comprises two first edges oppositely arranged along the first direction, and a plurality of rows of the first hollowed-out portions comprise a third sub-hollowed-out portion and a fourth sub-hollowed-out portion which are arranged at intervals, the first hollowed-out the third sub-hollowed-out portion close to the first edge do not penetrate the first edge, and the first hollowed-out holes of the fourth sub-hollowed-out portion close to the first edge penetrate the first edge.

Embodiments of the present disclosure provide a flexible display apparatus including a flexible display panel, and the above-described support structure attached to a backlight side of the flexible display panel.

Optionally, a buffer layer of a resilient material is provided between the support structure and the flexible display panel.

Advantageous effects of the present disclosure are: A first hollowed-out pattern is provided in the bendable region, and a second hollowed-out pattern is provided in the transitional region, and the density of the first hollowed-out holes distributed in the first hollowed-out pattern is greater than the density of the second hollowed-out holes distributed in the second hollowed-out pattern, so that the rebound phenomenon of the support structure itself can be prevented from occurring, so that the support can be well adhered to the flexible display panel.

DETAILED DESCRIPTION

In order that the objects, aspects and advantages of the embodiments of the present disclosure will become more apparent, a more particular description of the embodiments of the present disclosure will be rendered by reference to the appended drawings. It is to be understood that the described embodiments are part, but not all, of the disclosed embodiments. Based on the embodiments of the present disclosure described, all other embodiments available to one of ordinary skill in the art are within the scope of the present disclosure.

In describing the present disclosure, it should be noted that the terms "central", "upper", "lower", "left", "right", "vertical", "horizontal", "inner", "outer", and the like indicate orientations or positional relationships based on the orientations or positional relationships shown in the figures, merely to facilitate description of the present disclosure and simplify the description, and do not indicate or imply that the referenced devices or elements must have a particular orientation, be constructed and operated in a particular orientation, and thus should not be construed as limiting the present disclosure. Furthermore, the terms "first", "second", and "third" are used for descriptive purposes only and are not to be construed as indicating or implying relative importance.

Figure 1:
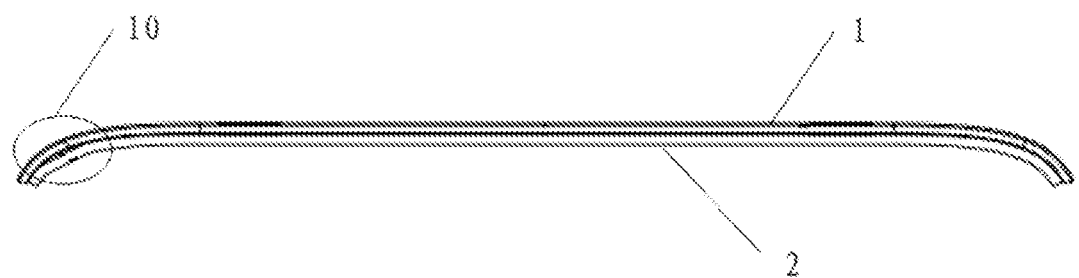
FIG. 1 is a view illustrating a state in which a support member rebounds in the related art.
Figure 2:
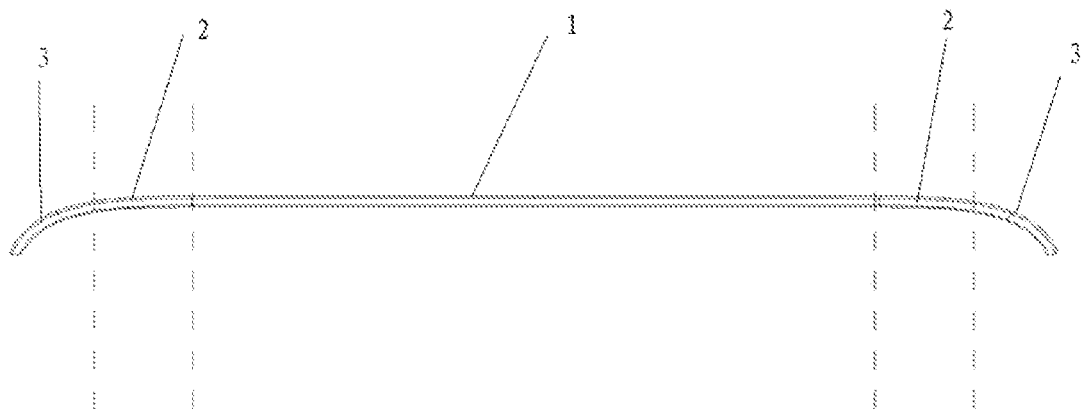
FIG. 2 shows a schematic view of a support structure in an embodiment of the present disclosure.
Figure 3:
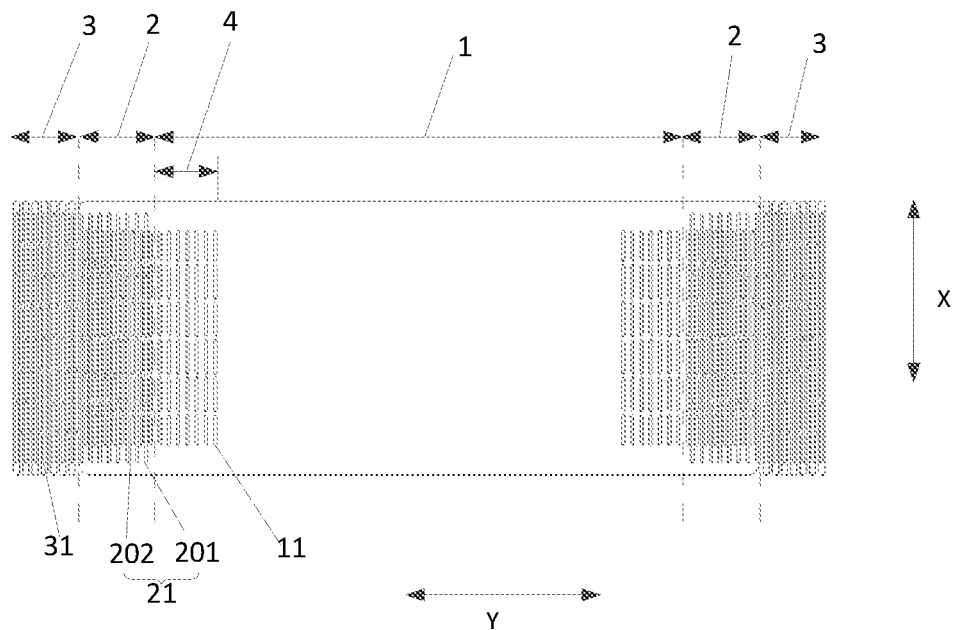
FIG. 3 is a schematic view showing a structure of a first hollowed-out pattern, a second hollowed-out pattern and a third hollowed-out pattern in the embodiment of the present disclosure.
Figure 4:
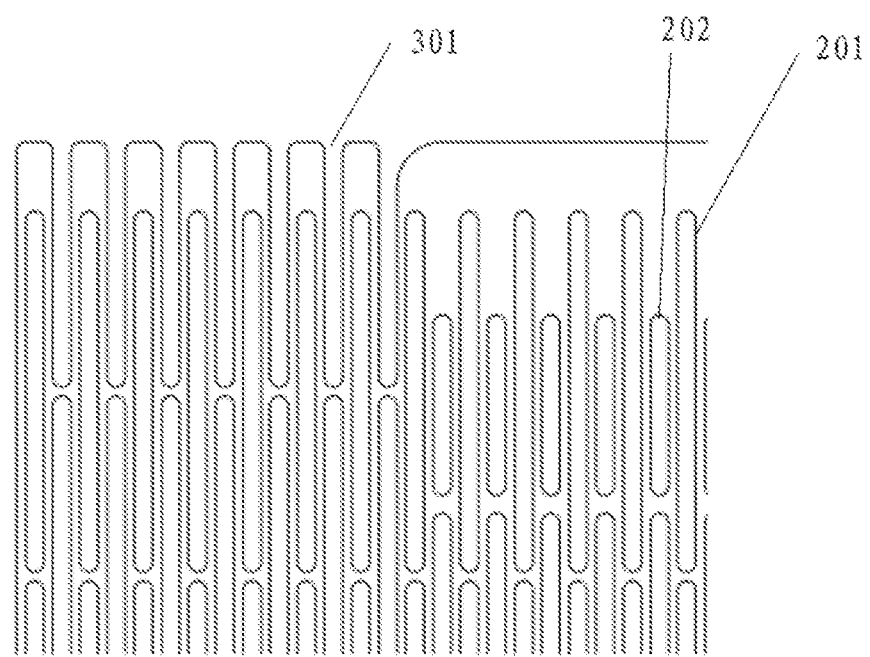
FIG. 4 is a partial schematic view showing a first hollowed-out pattern and a second hollowed-out pattern according to an embodiment of the present disclosure.

The support member 2 is attached to one side of the display panel 1. In the related art, the support member is generally made of a metal, and the metal material has a relatively high modulus (10 GPa-200 GPa), a relatively strong hardness and rigidity, and can provide a good overall support and rigidity supplement for a flexible display panel, and can also correct some problems of high-temperature softening and stress creep. However, the metal material with high hardness is difficult to be processed, and the bendable region tends to rebound, which affects the fitting effect of the support and the display panel. In FIG. 1 there is shown a schematic representation of the support member in a state of rebound, the region indicated by the circle 10 being the region of rebound.

In order to solve the above-mentioned technical problem, the present embodiment provides a support structure, wherein a hollowed-out pattern is provided in both the transitional region 2 and the bendable region 3 adjacent to the non-bendable region 1 so as to reduce the rigidity of the support structure, and a plurality of first hollowed-out holes 31 with a first density are distributed in the first hollowed-out pattern provided in the bendable region 3, and a plurality of second hollowed-out holes 21 with a second density are distributed in the second hollowed-out pattern of the transitional region 2, wherein the first density is greater than the second density so as to be able to adapt to display panels with different curvatures. Furthermore, it is possible to reduce the stress difference between the non-bendable region 1 and the bendable region 3 and to avoid the occurrence of cracks at the junction of the non-bendable region 1 and the bendable region 3.

Specifically, as shown in FIGS. 2-5, the present embodiment provides a support structure for supporting a flexible display panel, comprising a bendable region 3, a non-bendable region 1 and a transitional region 2 located between the bendable region 3 and the non-bendable region 1;

The bendable region 3 is provided with a first hollowed-out pattern, and the first hollowed-out pattern comprises a plurality of first hollowed-out holes 31;

The transitional region 2 is provided with a second hollowed-out pattern, and the second hollowed-out pattern comprises a plurality of second hollowed-out holes 21;

The distribution density of the plurality of first hollowed-out holes 31 is greater than the distribution density of the plurality of second hollowed-out holes 21.

The support structure in the present embodiment is a plate-like structure made of metal, and with the above-mentioned solution, the rigidity of the support structure can be reduced, the bending ability of the support structure can be improved, and the reliability of the metal support can be improved.

Exemplarily in the present embodiment, the non-bendable region 1 comprises a first region 4 adjacent to the transitional region 2, the first region 4 is provided with a third hollowed-out pattern, the third hollowed-out pattern comprises a plurality of third hollowed-out holes 31, the density of the plurality of third hollowed-out holes 31 is less than the density of the plurality of second hollowed-out holes 21.

In a specific embodiment in the present embodiment, the density of the plurality of first hollowed-out holes 31 is greater than the density of the plurality of second hollowed-out holes 21, and the distribution density of the plurality of second hollowed-out holes 21 is greater than the distribution density of the plurality of third hollowed-out holes 31.

When the support structure is bent, the stress on the patterned region where the hollowed-out pattern is provided is relatively small, while the stress on the non-patterned region adjacent to the patterned region is relatively large there is a relatively large stress concentration at the interface of the patterned region and the non-patterned region of the support structure, and the stress concentration is liable to cause the support to break. In order to facilitate the uniformity of stress dispersion, in the present embodiment, the bendable region 3 is provided with a first hollowed-out pattern, the transitional region 2 is provided with a second hollowed-out pattern, and the first region 4 is provided with a third hollowed-out pattern, and the distribution density of the plurality of first hollowed-out holes 31 in the first hollowed-out pattern, the distribution density of the plurality of second hollowed-out holes 21 in the second hollowed-out pattern and the distribution density of the plurality of third hollowed-out holes 31 in the third hollowed-out holes 31 are different, preferably, the density of the plurality of first hollowed-out holes 31 is greater than the density of the plurality of second hollowed-out holes 21, and the density of the plurality of second hollowed-out holes 21 is greater than the density of the plurality of third hollowed-out holes 31, so as to reduce the difference in stress between adjacent regions, facilitate the uniformity of stress distribution, and effectively prevent fracture of the support structure.

Illustratively in the present embodiment, the bending axis of the bendable region 3 extends along a first direction (referring to the X direction in FIG. 3), the first hollowed-out hole 31, the second hollowed-out hole 21 and the third hollowed-out hole 11 are strip-shaped through holes extending along the first direction, the length of the first hollowed-out hole 31 is greater than or equal to the length of the second hollowed-out hole 21, and the length of the second hollowed-out hole 21 is greater than or equal to the length of the third hollowed-out hole 11.

In order to reduce the rigidity of the support structure successively from the non-bendable region 1, the transitional region 2 and the bendable region 3, the distribution density of the hollowed-out holes in each region is different, and the specific shapes and distribution modes of the first hollowed-out hole 31, the second hollowed-out hole 21 and the third hollowed-out hole 11 can be various, and the shapes of the first hollowed-out hole 31, the second hollowed-out hole 21 and the third hollowed-out hole 11 can be the same or different, and the shapes of the two hollowed-out holes of the first hollowed-out hole 31, the second hollowed-out hole 21 and the third hollowed-out hole 11 can be the same. Since the support structure is bent in a second direction (referring to the Y direction in FIG. 3) perpendicular to the first direction, in the present embodiment, the first hollowed-out hole 11, the second hollowed-out hole 21 and the third hollowed-out hole 11 are strip-shaped through holes extending and arranged along the first direction.

Figure 5:
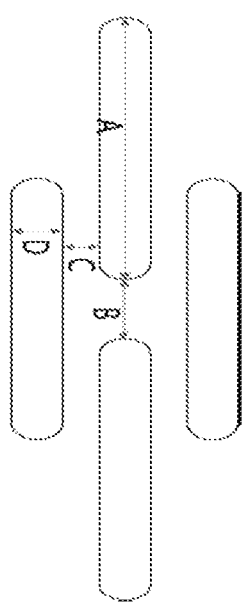
FIG. 5 is a schematic diagram showing setting parameters of the first hollowed-out pattern, the second hollowed-out pattern and the third hollowed-out pattern in the embodiment of the present disclosure.

With reference to FIG. 5, A represents the length of the corresponding hollowed-out hole, and in the present embodiment, for example, the length of the first hollowed-out hole 31 is greater than the length of the second hollowed-out hole 21, and the length of the second hollowed-out hole 21 is greater than the length of the third hollowed-out hole 11, so as to facilitate the rigidity of each corresponding region to be successively reduced.

In the present embodiment, for example, the lengths of the plurality of first hollowed-out holes 31 are identical, the lengths of the plurality of second hollowed-out holes 21 are identical, and the lengths of the plurality of third hollowed-out holes 31 are identical; however, it should be noted that the lengths of the plurality of hollowed-out holes located in the same region may be identical, may be completely different, or may not be identical, and can be specifically set according to actual needs.

In the present embodiment, the shapes of the first hollowed-out hole 31, the second hollowed-out hole 21 and the third hollowed-out hole 11 are not limited, and can be regular or irregular shapes such as a circle, an oval, a rectangle, a polygon or a combination thereof.

In a particular embodiment of the present embodiment, the first hollowed-out hole, the second hollowed-out hole 21 and the third hollowed-out hole 11 are strip-shaped structures, and are composed of a rectangle and two semi-circles respectively located on two opposite short sides of the rectangle, and since there is no sharp corner, stress concentration at the end of the rectangle can be avoided, thereby avoiding fracture of the support structure when bending along the bendable region 3.

As exemplary in the present embodiment, the first hollowed-out pattern comprises a plurality of rows of first hollowed-out portions arranged side by side along a second direction perpendicular to the first direction, each row of the first hollowed-out portions comprises a plurality of first hollowed-out holes 31, a first connecting portion is provided between two adjacent first hollowed-out holes 31 in each row of the first hollowed-out portions, and the projection of the first connecting portion in the second direction is located on a corresponding the first hollowed-out hole 31 of an adjacent the first hollowed-out portion;

The second hollowed-out pattern comprises a plurality of rows of second hollowed-out portions arranged side by side along a second direction perpendicular to the first direction, each row of the second hollowed-out portions comprises a plurality of second hollowed-out holes 21, a second connecting portion is provided between two adjacent second hollowed-out holes 21 in each row of the second hollowed-out portions, and the projection of the second connecting portion in the second direction is located on a corresponding the second hollowed-out hole 21 of an adjacent the second hollowed-out portion;

The third hollowed-out pattern comprises a plurality of rows of third hollowed-out portions arranged side by side in a second direction perpendicular to the first direction, and each row of the third hollowed-out portions comprises a plurality of third hollowed-out holes 31.

When bending the support structure along a bending axis (the bending axis extending and arranged along the first direction) of the bendable region 3, a force direction of the support structure is parallel to the second direction (perpendicular to the first direction). Considering that if the first hollowed-out holes 31 in two adjacent rows of the first hollowed-out portions are arranged to face each other, the solid portion between the two adjacent rows of the first hollowed-out holes 31 is continuous along the first direction, and thus when bending the support structure along the bending axis of the bendable region 3, the solid portion between the two adjacent rows of the first hollowed-out holes 31 is subjected to a greater stress, and the bendable region 3 is easily broken. By the same reasoning, if the second hollowed-out holes 21 in two adjacent rows of the second hollowed-out portions are arranged to face each other, the solid portion between the two adjacent rows of the second hollowed-out holes 21 is subjected to a greater stress, and the transitional region 2 is easily broken. In order to solve this problem, in one embodiment of the present embodiment, the projection of the first connecting portion in the second direction is located on the first hollowed-out holes 31 corresponding to the adjacent first hollowed-out portions, namely, the first hollowed-out holes 31 in two adjacent rows of the first hollowed-out portions are arranged alternately, and the projection of the second connecting portion in the second direction is located on the second hollowed-out holes 21 corresponding to the adjacent second hollowed-out portions, namely, the second hollowed-out holes 21 in two adjacent rows of the second hollowed-out portions are arranged alternately. Fracture of the support structure is avoided.

Exemplarily in the present embodiment, two adjacent rows of the first hollowed-out portions in the first hollowed-out pattern are provided, one of the first connecting portions in one row of the first hollowed-out portions is a first sub-connecting portion, and the first hollowed-out hole 31 corresponding to the first sub-connecting portion in the other row of the first hollowed-out portions is a first sub-hollowed-out hole 201, and the projection of the first sub-connecting portion in the second direction is located at the center of the first sub-hollowed-out hole 201.

It should be noted that the lengths of the plurality of first hollowed-out holes 31 in a plurality of columns of the first hollowed-out portions in the first direction may be the same and may be different, and the distribution of the plurality of first hollowed-out holes 31 is set according to actual needs, and then the positions of the first connecting portions between two adjacent the first hollowed-out holes 31 in one column of the first hollowed-out portions corresponding to the first hollowed-out portions in the other columns may be different.

Exemplarily in the present embodiment, the second hollowed-out holes 21 comprise a first sub-hollowed-out portion and a second sub-hollowed-out portion arranged side by side and staggered along the first direction, the first sub-hollowed-out portion comprises a plurality of first sub-hollowed-out holes 201, the second sub-hollowed-out portion comprises a plurality of second sub-hollowed-out holes 202, the length of the first sub-hollowed-out holes 201 is greater than the length of the second sub-hollowed-out holes 202, and the orthographic projection of one the second sub-hollowed-out hole 202 on an adjacent the first sub-hollowed-out portion is located in the middle of the corresponding the first sub-hollowed-out hole 201.

It should be noted that the lengths of the second hollowed-out holes 21 may be the same or different, the lengths of the second hollowed-out holes 21 in the same row of the second hollowed-out portions may be the same or different, and the orthographic projection of one the second sub-hollowed-out hole 202 on an adjacent the first sub-hollowed-out portion is not limited to being located in the middle of the corresponding the first sub-hollowed-out hole 201.

Exemplarily in the present embodiment, two adjacent first hollowed-out holes 31 in the same column of the first hollowed-out portions have a first spacing therebetween, two adjacent second hollowed-out holes 21 in the same column of the second hollowed-out portions have a second spacing therebetween, and two adjacent third hollowed-out portions in the same column of the third hollowed-out portions have a third spacing therebetween, the first spacing being less than or equal to the second spacing, and the second spacing being less than or equal to the third spacing.

Illustratively in this embodiment, the first pitch is less than the second pitch and the second pitch is less than the third pitch.

B in FIG. 5 represents the spacing between two adjacent hollowed-out holes located in the same row of hollowed-out portions, and different arrangements of the first spacing, the second spacing and the third spacing facilitate different arrangements of the density of the first hollowed-out holes 31, the density of the second hollowed-out holes 21 and the density of the third hollowed-out holes 31, thereby facilitating different changes in the rigidity of corresponding various regions. And the first spacing is smaller than the second spacing, and the second spacing is smaller than the third spacing, so that the rigidity of the non-bendable region 1, the transitional region 2 and the bendable region 3 successively decreases, so that the bending stress of each region can be slowly transitioned to prevent the support structure from breaking.

Exemplarily in the present embodiment, two adjacent columns of the first hollowed-out portions have a fourth spacing in the second direction, two adjacent columns of the second hollowed-out portions have a fifth spacing in the second direction, and two adjacent columns of the third hollowed-out portions have a sixth spacing therebetween, the fourth spacing being less than or equal to the fifth spacing, and the fifth spacing being less than or equal to the sixth spacing.

Illustratively in this embodiment, the fourth pitch is smaller than the fifth pitch, which is smaller than the sixth pitch.

C in FIG. 5 represents the spacing between two adjacent hollowed-out portions located in the same region, and different arrangements of the fourth spacing, the fifth spacing and the sixth spacing facilitate different arrangements of the density of the first hollowed-out hole 31, the density of the second hollowed-out hole 21 and the density of the third hollowed-out hole 11, thereby facilitating different changes in the rigidity of corresponding various regions. And the fourth spacing is smaller than the fifth spacing, and the fifth spacing is smaller than the sixth spacing, so as to facilitate the rigidity of the non-bendable region 1, the transitional region 2 and the bendable region 3 being successively reduced, so that the bending stress of each region can be slowly transitioned to prevent the support structure from being broken.

Illustratively in this embodiment, the first hollowed-out hole 31, the second hollowed-out hole 21 and the third hollowed-out hole 11 have the same width in the second direction. D in FIG. 5 represents the width of each hollowed-out hole located in the same region in the second direction.

Illustratively in this embodiment, the support structure has a thickness of 0.02-0.3 mm, but this is not limiting.

Illustratively in this embodiment, the bendable region has a bend radius R of 0.2-10 mm. The bending radius R of the transitional region is greater than 10 mm, and the length of the first region 4 in the non-bendable region is 0-10 mm, but this is not limiting.

Referring to FIG. 5, the parameters of each hollowed-out hole in each region in the present embodiment are shown in the following table:

| Item | Support structure | | |
|---|---|---|---|
| Thickness/mm | 0.02-0.3 | | |
| Pattern region, mm | Bendable region | Transitional region | First region |
|  | 0.2-10 | >10 | 0-10 |
| A, mm | 10-5 | 5-3 | 3-1 |
| B, mm | 0.1-0.3 | 0.1-0.5 | 0.5-2 |
| C, mm | 0.1-0.3 | 0.1-0.5 | 0.1-0.5 |
| D, mm | 0.1-0.5 | 0.1-0.5 | 0.1-0.5 |

Referring to FIG. 5, in a specific embodiment of the present embodiment, the parameters of each hollowed-out hole in each region are shown in the following table:

| Item | Support structure | | |
|---|---|---|---|
| Thickness/mm | 0.1 | | |
| Pattern region, mm | Bendable region | Transitional region | First region |
|  | 4.2 | 5.0 | 4.0 |
| A, mm | 5 | 3 | 2.5 |
| B, mm | 0.2 | 0.3 | 3 |
| C, mm | 0.2 | 0.3 | 0.8 |
| D, mm | 0.3 | 0.3 | 0.3 |

Exemplarily in the present embodiment, the first hollowed-out pattern comprises two first edges oppositely arranged along the first direction, and a plurality of rows of the first hollowed-out portions comprise a third sub-hollowed-out portion and a fourth sub-hollowed-out portion which are arranged at intervals, the first hollowed-out hole 31 of the third sub-hollowed-out portion close to the first edge does not penetrate the first edge, and the first hollowed-out hole 31 of the fourth sub-hollowed-out portion close to the first edge penetrates the first edge.

If a plurality of rows of the edge hollowed-out holes 301 of the first hollowed-out portions close to the first edge all have a certain distance from the first edge, namely, the portion between the first edge and the edge hollowed-out holes 301 is a non-hollowed-out solid portion, when bending, the portion between the first edge and the edge hollowed-out holes 301 is a non-hollowed-out solid portion is subjected to a greater stress, and the bendable region 3 is easily broken. In the present embodiment, the provision of the first hollowed-out hole 31 of the fourth sub-hollowed-out portion relieves the stress to which the portion between the first edge and the edge hollowed-out hole 301 is a non-hollowed-out solid portion, so as to avoid the fracture of the edge of the bendable region 3.

In one embodiment of the present embodiment, the first hollowed-out holes 31 of each row of the first hollowed-out portions close to the first edge are arranged through the first edge, effectively lifting the flexibility of the support structure in the second direction, avoiding the breakage of the edge of the bendable region 3.

Since the required flexibility of the transitional region 2 is less than the flexibility required for the bendable region 3, in the present embodiment, a plurality of rows of the second hollowed-out portions do not extend through the first edge but are not limited thereto, and a plurality of rows of the second hollowed-out portions may also extend at least partially through the first edge.

The non-bendable region 1 mainly plays a supporting role, and the arrangement of the third hollowed-out pattern on the first region 4 is to reduce the stress difference between the non-bendable region 1 and the transitional region 2; therefore, in the present embodiment, multiple rows of third hollowed-out holes 31 of the third hollowed-out portion close to the first edge may not be arranged through the first edge, but are not limited thereto.

Embodiments of the present disclosure provide a flexible display apparatus including a flexible display panel, and the above-described support structure attached to a backlight side of the flexible display panel.

Illustratively in this embodiment, a buffer layer of resilient material is disposed between the support structure and the flexible display panel.

The elastic material may be rubber, silica gel, foam, etc. to prevent the support structure from crushing the display panel.

It is noted that in the present embodiment, the flexible display apparatus comprises a flexible display panel, and in one embodiment, the flexible display panel is an OLED display panel, and the support structure is located on the backlight side of the flexible display panel, and in an embodiment where the flexible display apparatus comprises a backlight assembly, the backlight assembly is located between the flexible display panel and the metal support.

While the foregoing is directed to the preferred embodiments of the present disclosure, it will be understood by those skilled in the art that various changes in form and details may be made therein without departing from the spirit and scope of the disclosure.

What is claimed is:

1. A support structure for supporting a flexible display panel, the support structure comprising: a bendable region; a non-bendable region; and a transitional region between the bendable region and the non-bendable region, wherein:
the bendable region is provided with a first hollowed-out pattern, and the first hollowed-out pattern comprises a plurality of first hollowed-out holes;
the transitional region is provided with a second hollowed-out pattern, and the second hollowed-out pattern comprises a plurality of second hollowed-out holes; and
the distribution density of the plurality of first hollowed-out holes is greater than the distribution density of the plurality of second hollowed-out holes,
wherein the non-bendable region comprises a first region adjacent to the transitional region, the first region is provided with a third hollowed-out pattern, the third hollowed-out pattern comprises a plurality of third hollowed-out holes, and the distribution density of the plurality of third hollowed-out holes is less than the distribution density of the plurality second hollowed-out holes,
wherein the bending axis of the bendable region extends along a first direction, the first hollowed-out holes, the second hollowed-out holes and the third hollowed-out holes are strip-shaped through holes extending along the first direction, the length of each of the first hollowed-out holes is greater than or equal to the length of each of the second hollowed-out holes, and the length of each of the second hollowed-out holes is greater than or equal to the length of each of the third hollowed-out holes,
wherein:
the first hollowed-out pattern comprises a plurality of rows of first hollowed-out portions arranged side by side along a second direction perpendicular to the first direction, each row of the first hollowed-out portions comprises a plurality of first hollowed-out holes, a first connecting portion is provided between two adjacent first hollowed-out holes in each row of the first hollowed-out portions, and the projection of the first connecting portion in the second direction is located on the first hollowed-out holes corresponding to the adjacent first hollowed-out portions;

the second hollowed-out pattern comprises a plurality of rows of second hollowed-out portions arranged side by side along a second direction perpendicular to the first direction, each row of the second hollowed-out portions comprises a plurality of second hollowed-out holes, a second connecting portion is provided between two adjacent second hollowed-out holes in each row of the second hollowed-out portions, and the projection of the second connecting portion in the second direction is located on the second hollowed-out holes corresponding to the adjacent second hollowed-out portions; and the third hollowed-out pattern comprises a plurality of rows of third hollowed-out portions arranged side by side in a second direction perpendicular to the first direction, and each row of the third hollowed-out portions comprises a plurality of third hollowed-out holes.

2. The support structure according to claim 1, wherein in two adjacent rows of the first hollowed-out portions in the first hollowed-out pattern, one of the first connecting portions in one row of the first hollowed-out portions is a first sub-connecting portion, the first hollowed-out hole corresponding to the first sub-connecting portion in the other row of the first hollowed-out portions is a first sub-hollowed-out hole, and the projection of the first sub-connecting portion in the second direction is located at the center of the first sub-hollowed-out hole.

3. The support structure according to claim 1, wherein the second hollowed-out holes comprise a first sub-hollowed-out portion and a second sub-hollowed-out portion arranged side by side and staggered along the first direction, the first sub-hollowed-out portion comprises a plurality of first sub-hollowed-out holes, the second sub-hollowed-out portion comprises a plurality of second sub-hollowed-out holes, the length of the first sub-hollowed-out holes is greater than the length of the second sub-hollowed-out holes, and the orthographic projection of one of the second sub-hollowed-out holes on an adjacent one of the first sub-hollowed-out portions is located in the middle of the corresponding one of the first sub-hollowed-out holes.

4. The support structure according to claim 1, wherein two of the first hollowed-out holes adjacent in the same column of the first hollowed-out portions have a first spacing therebetween, two of the second hollowed-out holes adjacent in the same column of the second hollowed-out portions have a second spacing therebetween, and two of the third hollowed-out portions adjacent in the same column of the third hollowed-out portions have a third spacing therebetween, the first spacing being less than or equal to the second spacing, and the second spacing being less than or equal to the third spacing.

5. The support structure according to claim 4, wherein the first pitch is less than the second pitch and the second pitch is less than the third pitch.

6. The support structure according to claim 1, wherein two adjacent rows of the first hollowed-out portions have a fourth spacing in the second direction, two adjacent rows of the second hollowed-out portions have a fifth spacing in the second direction, and two adjacent rows of the third hollowed-out portions have a sixth spacing therebetween, the fourth spacing being less than or equal to the fifth spacing, and the fifth spacing being less than or equal to the sixth spacing.

7. The support structure according to claim 6, wherein the fourth pitch is less than the fifth pitch which is less than the sixth pitch.

8. The support structure according to claim 1, wherein the first hollowed-out hole, the second hollowed-out hole and the third hollowed-out hole have the same width in the second direction.

9. The support structure according to claim 1, wherein the first hollowed-out pattern comprises two first edges oppositely arranged along the first direction, and a plurality of rows of the first hollows comprise a third sub-hollow and a fourth sub-hollow arranged at intervals, and wherein the first-hollowed-out holes of the third sub-hollow close to the first edge do not penetrate the first edge, and the first hollowed-out holes of the fourth sub-hollow close to the first edge penetrate the first edge.

10. A flexible display apparatus, comprising: a flexible display panel; and a support structure attached to the backlight side of the flexible display panel, wherein:

the support structure comprises a bendable region, a non-bendable region and a transitional region between the bendable region and the non-bendable region;

the bendable region is provided with a first hollowed-out pattern, and the first hollowed-out pattern comprises a plurality of first hollowed-out holes;

the transitional region is provided with a second hollowed-out pattern, and the second hollowed-out pattern comprises a plurality of second hollowed-out holes; and the distribution density of the plurality of first hollowed-out holes is greater than the distribution density of the plurality of second hollowed-out holes, wherein the non-bendable region comprises a first region adjacent to the transitional region, the first region is provided with a third hollowed-out pattern, the third hollowed-out pattern comprises a plurality of third hollowed-out holes, and the distribution density of the plurality of B third hollowed-out holes is less than the distribution density of the plurality of second hollowed-out holes, wherein the bending axis of the bendable region extends along a first direction, the first hollowed-out holes, the second hollowed-out holes and the third hollowed-out holes are strip-shaped through holes extending along the first direction, the length of each of the first hollowed-out holes is greater than or equal to the length of each of the second hollowed-out holes, and the length of each of the second hollowed-out holes is greater than or equal to the length of each of the third hollowed-out holes, wherein:

the first hollowed-out pattern comprises a plurality of rows of first hollowed-out portions arranged side by side along a second direction perpendicular to the first direction, each row of the first hollowed-out portions comprises a plurality of first hollowed-out holes, a first connecting portion is provided between two adjacent first hollowed-out holes in each row of the first hollowed-out portions, and the projection of the first connecting portion in the second direction is located on the first hollowed-out holes corresponding to the adjacent first hollowed-out portions;

the second hollowed-out pattern comprises a plurality of rows of second hollowed-out portions arranged side by side along a second direction perpendicular to the first direction, each row of the second hollowed-out portions comprises a plurality of second hollowed-out holes, a second connecting portion is provided between two adjacent second hollowed-out holes in each row of the second hollowed-out portions, and the projection of the second connecting portion in the second direction is located on the second hollowed-out holes corresponding to the adjacent second hollowed-out portions; and the third hollowed-out pattern comprises a plurality of rows of third hollowed-out portions arranged side by side in a second direction perpendicular to the first direction, and each row of the third hollowed-out portions comprises a plurality of third hollowed-out holes.

11. The flexible display apparatus according to claim 10, wherein a buffer layer of an elastic material is provided between the support structure and the flexible display panel.

12. The flexible display apparatus according to claim 10, wherein in two adjacent rows of the first hollowed-out portions in the first hollowed-out pattern, one of the first connecting portions in one row of the first hollowed-out portions is a first sub-connecting portion, the first hollowed-out hole corresponding to the first sub-connecting portion in the other row of the first hollowed-out portions is a first sub-hollowed-out hole, and the projection of the first sub-connecting portion in the second direction is located at the center of the first sub-hollowed-out hole.

13. The flexible display apparatus according to claim 10, wherein the second hollowed-out holes comprise a first sub-hollowed-out portion and a second sub-hollowed-out portion arranged side by side and staggered along the first direction, the first sub-hollowed-out portion comprises a plurality of first sub-hollowed-out holes, the second sub-hollowed-out portion comprises a plurality of second sub-hollowed-out holes, the length of the first sub-hollowed-out holes is greater than the length of the second sub-hollowed-out holes, and the orthographic projection of one of the second sub-hollowed-out holes on an adjacent one of the first sub-hollowed-out portions is located in the middle of the corresponding one of the first sub-hollowed-out holes.

14. The flexible display apparatus according to claim 10, wherein two of the first hollowed-out holes adjacent in the same column of the first hollowed-out portions have a first spacing therebetween, two of the second hollowed-out holes adjacent in the same column of the second hollowed-out portions have a second spacing therebetween, and two of the third hollowed-out portions adjacent in the same column of the third hollowed-out portions have a third spacing therebetween, the first spacing being less than or equal to the second spacing, and the second spacing being less than or equal to the third spacing.

* * * * *